United States Patent
Perlberg et al.

(10) Patent No.: US 6,910,612 B2
(45) Date of Patent: *Jun. 28, 2005

(54) CAPILLARY WITH CONTAINED INNER CHAMFER

(75) Inventors: Gil Perlberg, Zihron-Yakov (IL); Arie Bahalul, Yokneam Elite (IL); Dan Mironescu, Yoqneam (IL); Moshe Amsalem, Kiryat Ata (IL); Jon Brunner, Sellersville, PA (US)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 52 days.

This patent is subject to a terminal disclaimer.

(21) Appl. No.: 10/639,302

(22) Filed: Aug. 12, 2003

(65) Prior Publication Data

US 2004/0094606 A1 May 20, 2004

Related U.S. Application Data

(63) Continuation-in-part of application No. 09/907,191, filed on Jul. 17, 2001, now Pat. No. 6,715,658.

(51) Int. Cl.[7] .............................. B23K 37/00; B23K 5/20
(52) U.S. Cl. ........................ 228/4.5; 228/1.1; 228/180.5
(58) Field of Search ........................ 228/1.1, 4.5, 180.5

(56) References Cited

U.S. PATENT DOCUMENTS

| | | |
|---|---|---|
| 3,917,148 A | 11/1975 | Runyon |
| 3,971,499 A | 7/1976 | Goodrich et al. |
| 4,405,074 A | 9/1983 | Levintov et al. |
| 4,821,944 A | 4/1989 | Tsumura |
| 4,974,767 A | 12/1990 | Alfaro et al. |
| 5,421,503 A | 6/1995 | Perlberg et al. |
| 5,437,405 A | 8/1995 | Asanasavest |
| 5,465,899 A | 11/1995 | Quick et al. |
| 5,558,270 A | 9/1996 | Nachon et al. |
| 5,662,261 A | 9/1997 | Fogal |
| 5,871,141 A | 2/1999 | Hadar et al. |
| 5,906,308 A | 5/1999 | Yamazaki et al. |
| 5,931,368 A * | 8/1999 | Hadar et al. ................. 228/4.5 |
| 5,954,260 A | 9/1999 | Orcutt |
| 5,984,162 A | 11/1999 | Hortaleza et al. |
| 6,041,995 A * | 3/2000 | Takahashi et al. .......... 228/164 |
| 6,065,667 A | 5/2000 | Singh |
| 6,155,474 A | 12/2000 | Orcutt |
| 6,213,378 B1 | 4/2001 | Singh |
| 6,325,269 B1 | 12/2001 | Suzuki et al. |
| 6,354,479 B1 | 3/2002 | Reiber et al. |
| 6,715,658 B2 * | 4/2004 | Perlberg et al. ............. 228/4.5 |
| 2001/0005054 A1 * | 6/2001 | Higashi et al. ............. 257/738 |
| 2001/0045443 A1 | 11/2001 | Miller et al. |
| 2002/0010069 A1 | 1/2002 | Shinji et al. |
| 2002/0033408 A1 | 3/2002 | Miller et al. |
| 2002/0096551 A1 | 7/2002 | Reiber et al. |
| 2002/0158374 A1 * | 10/2002 | Billiet et al. ................ 264/669 |

FOREIGN PATENT DOCUMENTS

| | | |
|---|---|---|
| EP | 0622149 | 11/1994 |
| EP | 0834919 | 4/1998 |
| JP | 63-239959 A | 10/1988 |
| JP | 04-149065 A | 5/1992 |
| JP | 09-162223 | 6/1997 |
| JP | 11-186315 A | 7/1999 |
| JP | 11-251357 A | 9/1999 |
| JP | 2001-351934 A * | 12/2001 |
| KR | 2001-068181 A | 7/2001 |
| WO | WO 98/49121 | 11/1998 |

* cited by examiner

Primary Examiner—Lynne R. Edmondson
(74) Attorney, Agent, or Firm—RatnerPrestia

(57) ABSTRACT

A bonding tool for bonding a fine wire to bonding pads having a very fine pitch is disclosed. The bonding tool comprises a working tip at an end thereof. The working tip includes an annular chamfer formed at an inner portion of the end of the working tip, the inner annular chamfer having an angle of less than about 60 degrees. The inner annular chamfer is coupled to a lower portion of a cylindrical passage formed in the bonding tool.

41 Claims, 15 Drawing Sheets

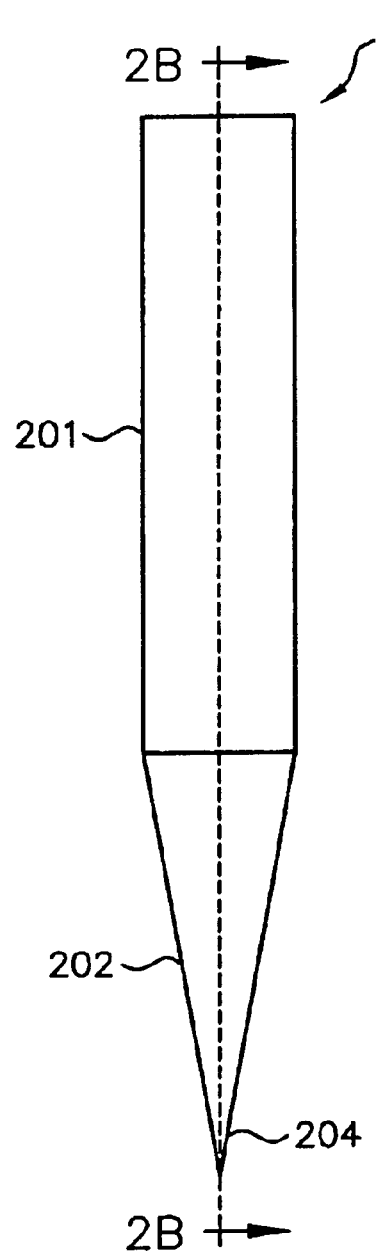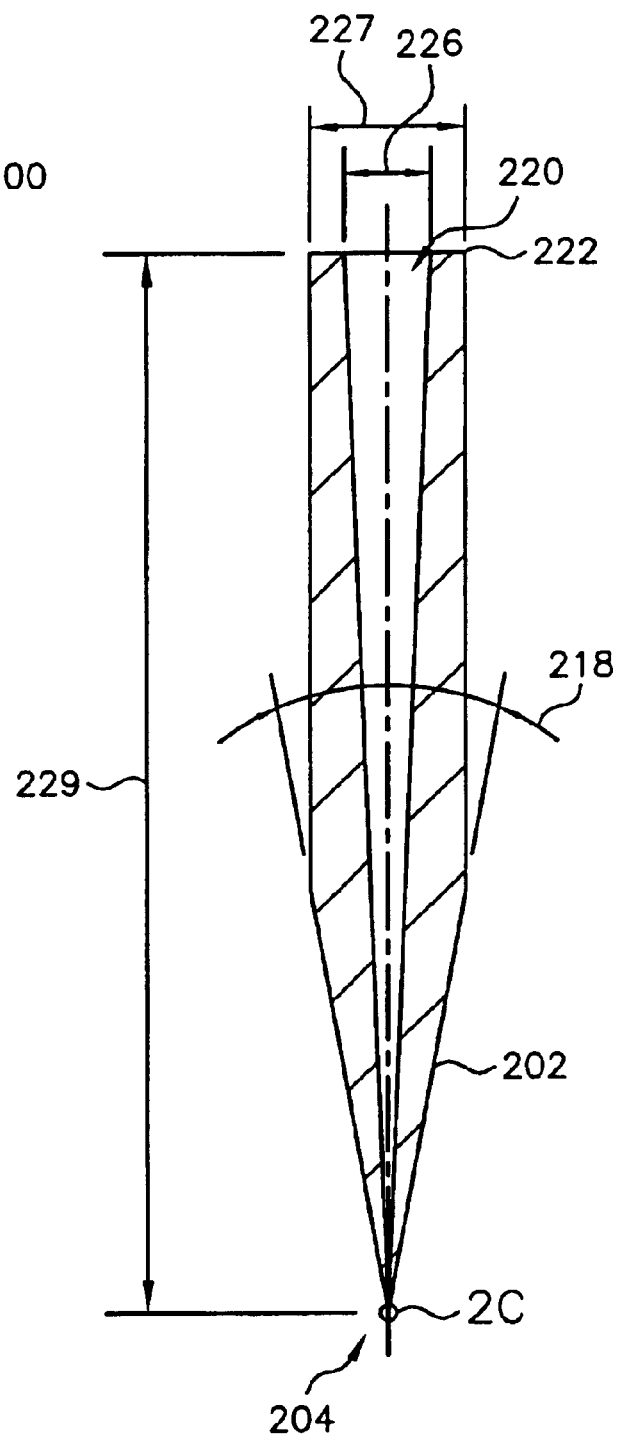
FIG. 2A
FIG. 2B

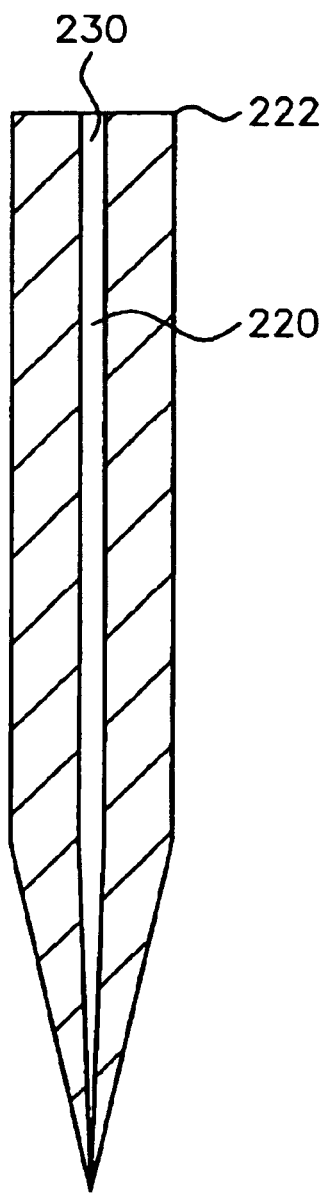 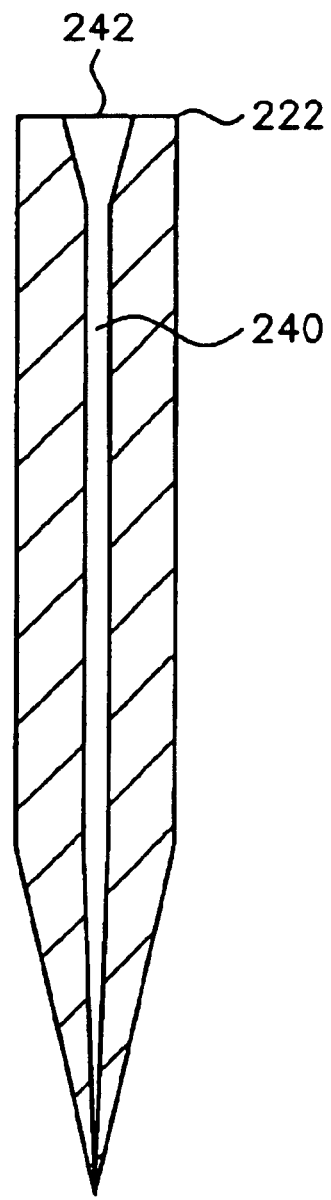
FIG. 2D  FIG. 2E

CAPILLARY WITH CONTAINED INNER CHAMFER

This application is a Continuation-in-Part of application Ser. No. 09/907,191 filed on Jul. 17, 2001, now U.S. Pat. No. 6,715,658.

BACKGROUND OF THE INVENTION

This invention relates generally to a tool for use in the bonding of wire to semiconductor devices and, more particularly to a bonding tool for bonding of fine wire to bonding pads set at a very fine pitch.

DESCRIPTION OF THE RELATED ART

Modern electronic equipment relies heavily on printed circuit boards on which semiconductor chips, or integrated circuits (ICs), are mounted. The mechanical and electrical connections between the chip and the substrate have posed challenges for chip designers. Three well known techniques for interconnecting the IC to the substrate are: wire bonding, tape automated bonding (TAB) and flip-chip.

The most common of these processes is wire bonding. In wire bonding, a plurality of bonding pads are located in a pattern on the top surface of the substrate, with the chip mounted in the center of the pattern of bonding pads, and the top surface of the chip facing away from the top surface of the substrate. Fine wires (which may be aluminum or gold wires) are connected between the contacts on the top surface of the chip and the contacts on the top surface of the substrate. Particularly, the connecting wires are supplied and bonded to the chip and to the substrate through a capillary, a bonding tool further described below.

Capillaries (bonding tools) are used for ball bonding the wire to electronic devices, particularly to bond pads of semiconductor devices. Such capillaries are generally formed from a ceramic material, principally aluminum oxide, tungsten carbide, ruby, zircon toughened alumina (ZTA), alumina toughened zircon (ATZ). Very thin wire, generally on the order of about one mil gold, copper or aluminum wire, is threaded through an axial passage in the capillary with a small ball being formed at the end of the wire, the ball being disposed external of the capillary tip. The initial object is to bond the ball to a pad on the semiconductor device and then to bond a portion farther along the wire to a lead frame or the like. During the bonding cycle, the capillaries perform more than one function.

After the ball is formed, the capillary must first center the ball partly within the capillary for bond pad targeting. With a first bonding step, the ball is bonded to a pad on a semiconductor device. When the capillary touches the ball down on the bond pad, the ball will be squashed and flatten out. As the bond pads are generally made from aluminum, a thin oxide forms on the surface of the bond pad. In order to form a proper bond, it is preferable to break the oxide surface and expose the aluminum surface. An effective way of breaking the oxide is to "scrub" the surface of the oxide with the wire ball. The wire ball is placed on the surface of the aluminum oxide and the capillary rapidly moves in a linear direction based on the expansion and contraction of a piezo-electric element placed within the ultrasonic horn to which the capillary is attached. The rapid motion, in addition to heat applied through the bond pad, forms an effective bond by transferring molecules between the wire and the bond pad.

The capillary then handles the wire during looping, smoothly feeding the bond wire both out of the capillary and then back into the capillary. The capillary then forms a "stitch" bond and a "tack" or "tail" bond.

Presently, thermosonic wire bonding is the process of choice for the interconnection of semiconductor devices to their supporting substrates. The thermosonic bonding process is partially dependent upon the transfer of ultrasonic energy from the transducer, attached to a movable bondhead, through a tool, e.g. capillary or wedge, to the ball or wire being welded to the semiconducting device or supporting substrate.

In conventional capillaries (bonding tools), the geometry of the bonding tool and the free air ball (FAB) formed thereby are such that the bonding tool can only be used to bond wires to bonding pads having an interpad spacing (pitch) of greater than 60 microns (0.060 mm; $15.34*10^{-4}$ in.]. Thus, making them unsuitable for bonding wires to devices produced to meet the higher density requirements of the semiconductor industry. These prior art bonding tools are also unsuitable for handling wire bonds using wire as small a 0.4 mils (10 microns) in diameter. The inventors of the present invention have developed a bonding tool that meets the demands imposed by these high-density devices while maintaining structural integrity of the bonding tool.

FIG. 1A is an illustration of a well-known prior art fine pitch bonding tool 100. Bonding tool 100 has a cylindrical portion 101, and a tapered potion 102 coupled between cylindrical portion 101 and working tip 104. Working tip 104 (at an end of bonding tool 100) has a tip angle of fifteen degrees relative to the longitudinal axis of bonding tool 100. In other words, working tip 104 has an overall angle 106 of 30 degrees. The reduced width of working tip 104 relative to cylindrical portion 101 permits ball bonds to be made on pads having a pitch of about 0.0032 in. without working tip 104 touching an adjacent loop of a bonded wire as explained in U.S. Pat. No. 5,558,270.

FIG. 1B is an illustration of an enlarged sectional view of working tip 104. As shown in FIG. 1B, working face 111 has a face angle 108 of 4 degrees, and tapered portion 104 has an overall angle 118 of 10 degrees. In addition, adjacent working face 111 is first inner chamfer 110, which, in turn, is adjacent second inner chamfer 112. First inner chamfer 110 has chamfer angle 114 of 90 degrees, and connects or continues with second inner chamfer 112 having an angle greater than 60 degrees. These chamfers are designed to guide a fine wire (not shown) into wire hole 116, having a diameter 106, to accommodate wire with a diameter of about 1 mil.

These prior art bonding tool are deficient, however, in that their design is not able to accommodate the ultra fine pitch (30 microns or less) bonding pad requirements placed upon the industry by semiconductor manufacturers. In addition, conventional bonding tools require the use of bonding wires that are less able to be properly routed by the tool in ultra fine pitch applications. Further, conventional bonding tools cannot provide a high level of inter metallic coverage between the bonding ball formed by the tool and the bonding pad. Further still, these bonding tools are formed from materials that are unable to withstand the forces and meet the elasticity requirements necessary to provide a bonding tool with working tip dimensions sufficient to meet the needs of the semiconductor industry.

SUMMARY OF THE INVENTION

To solve the aforementioned disadvantages of conventional bonding tools, the present invention relates to a bonding tool comprising a working tip at an end of the bonding tool. The working tip includes an inner annular chamfer formed at an inner portion of the end of the working tip, the inner annular chamfer having an angle of less than about 60 degrees; and a substantially cylindrical axial passage coupled to an upper end of the inner annular chamfer.

According to another aspect of the present invention, the inner annular chamfer has an overall angle of between about 40 degrees and 60 degrees.

According to a further aspect of the present invention, the working tip forms a bond between the wire and a bond pad on the substrate having an inter metallic bond coverage of greater than 82%.

According to another aspect of the present invention, the bonding tool is formed from a material comprising about 95% $ZrO_2$ by weight and about 5% $Y_2O_3$ by weight.

According to yet another aspect of the present invention, the bond between the wire and a bond pad has a shear strength of at least about 5.5 grams/mils$^2$.

According to still a further aspect of the present invention, the fine wire is formed by the working tip to have a Fabrication Volume $V_{FAB}$, the Fabrication Volume comprised of a Neck Volume $V_N$, a Inner Chamfer Volume $V_{IC}$ and a Squash Volume $V_S$, where: $V_{IC}$ is between about 40% to 50% of $V_{FAB}$, and $V_{FAB}=V_N+V_{IC}+V_S$.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures:

FIGS. 2A–2F are various views of a bonding tool according to a first exemplary embodiment of the present invention;

DETAILED DESCRIPTION

Figure 1A:
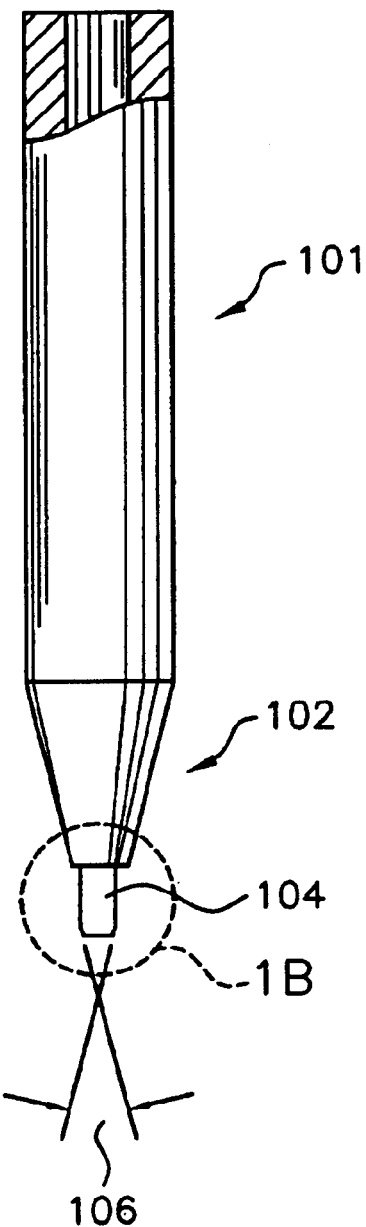
FIGS. 1A and 1B are various side views of a conventional bonding tool.
Figure 1B:
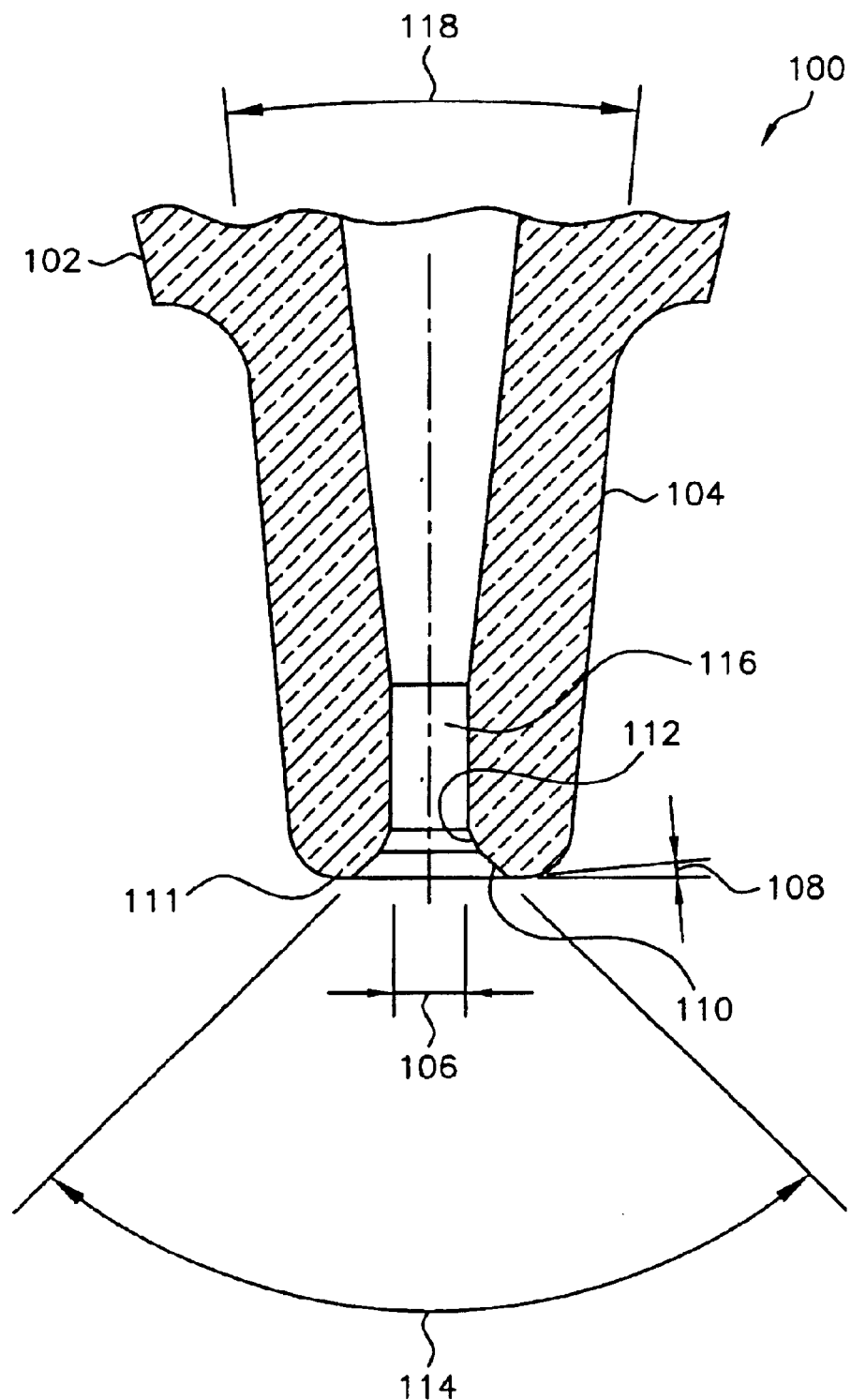

The present invention overcomes the deficiencies of conventional capillary bonding tools by providing a bonding tool having a working tip including a tapered section having a predetermined angle with respect to the longitudinal axis of the first cylindrical section, ii) a working face with a first annular chamfer formed at an outside portion of an end of the working tip, and iii) a second annular chamfer formed at an inside portion of the end of the working tip, the first and second annular chamfer adjacent one another; and a substantially cylindrical axial passage coupled to an upper portion of the second annular chamfer. The resultant bonding tool is able to apply bonding wire of as small as 10 microns to bonding pads having a pitch of 30 microns or less.

FIG. 2A is a side view of a bonding tool 200 according to a first exemplary embodiment of the present invention. As shown in FIG. 2A, bonding tool 200 has a cylindrical body portion 201, a tapered portion 202 coupled to the end of cylindrical body portion 201, and a working tip 204 coupled to the end of tapered portion 202. In a preferred embodiment, bonding tool 200 is formed from a unitary piece of material. The specifics of the material used to form the bonding tool are discussed in detail below.

FIG. 2B is a sectional side view of bonding tool 200. As shown in FIG. 2B, bonding tool 200 has a diameter 227 of between about 1.5 and 1.6 mm and preferably about 1.588 mm. Further, bonding tool 200 has a length of between about 9.5 and 11.1 mm. Tapered portion 202 has a substantially constant taper 218 of between about 18° and 22° starting from the point at which it meets cylindrical section 201. In one exemplary embodiment, the taper is between about 19° and 21°, and preferably 20°. Axial passage 220 extends from upper end 222 to working tip 204 of bonding tool 200. In an exemplary embodiment, axial passage 220 has a substantially continuous tapered shape having a predetermined angle 226 of about 3°±1° over a portion of its length. As the axial passage 220 approaches working tip 204, this taper transitions to about 6°±1°. The invention is not so limited, however, and it is contemplated that axial passage 220 may be have a substantially constant diameter or tapered over only a portion of the length of bonding tool 200. The latter may be desired in order to facilitate wire insertion at upper end 222 of bonding tool 200. Examples of such alternate axial passages are illustrated in FIGS. 2D and 2E.

As shown in FIG. 2D, axial passage 220 has a substantially constant diameter 230 along the length of bonding tool 200. In FIG. 2E, axial passage 220 has a substantially constant diameter 240 along a portion of the length of bonding tool 200, and has a taper 242 adjacent upper end 222 of bonding tool 200.

Figure 2C:
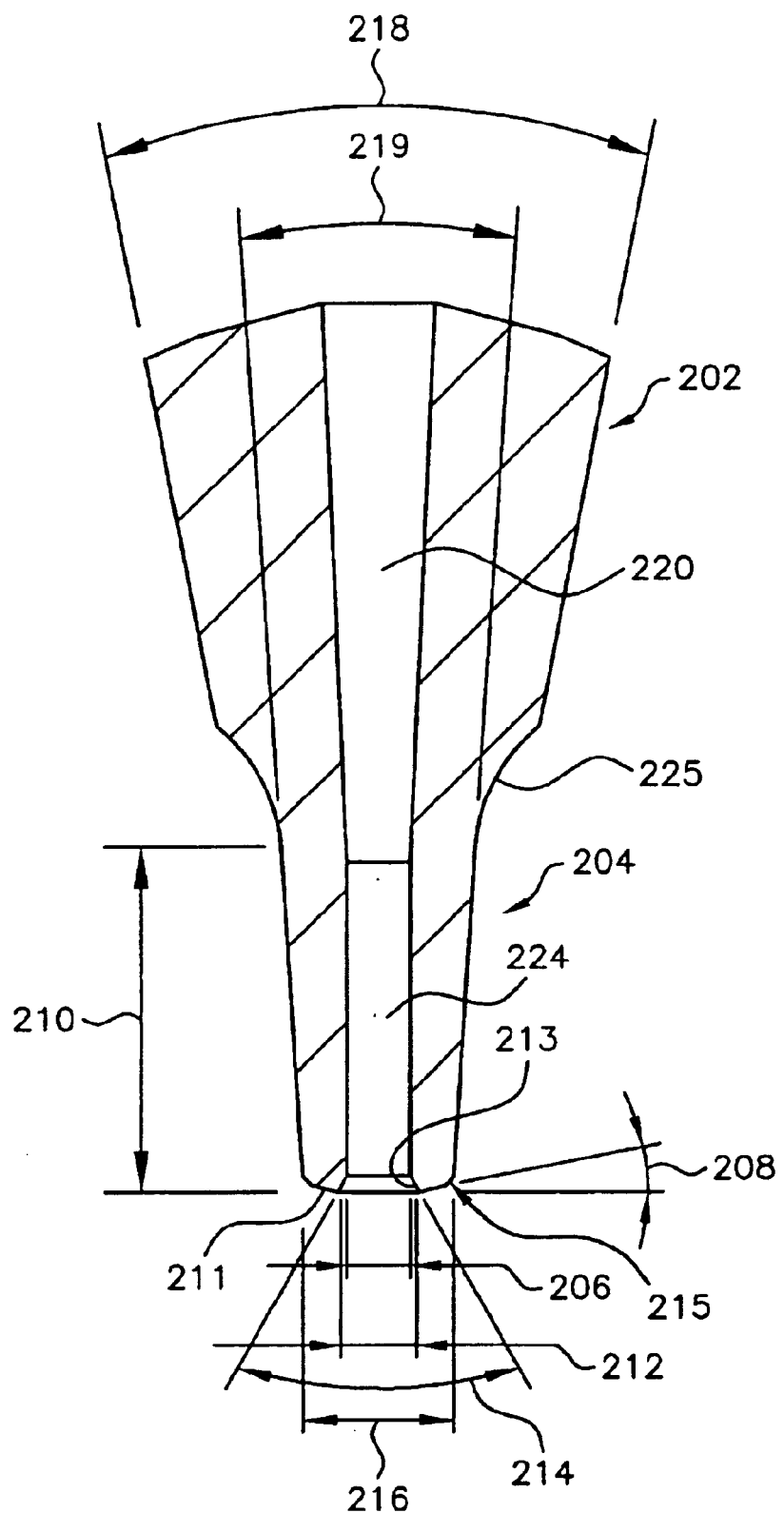
Figure 2F:
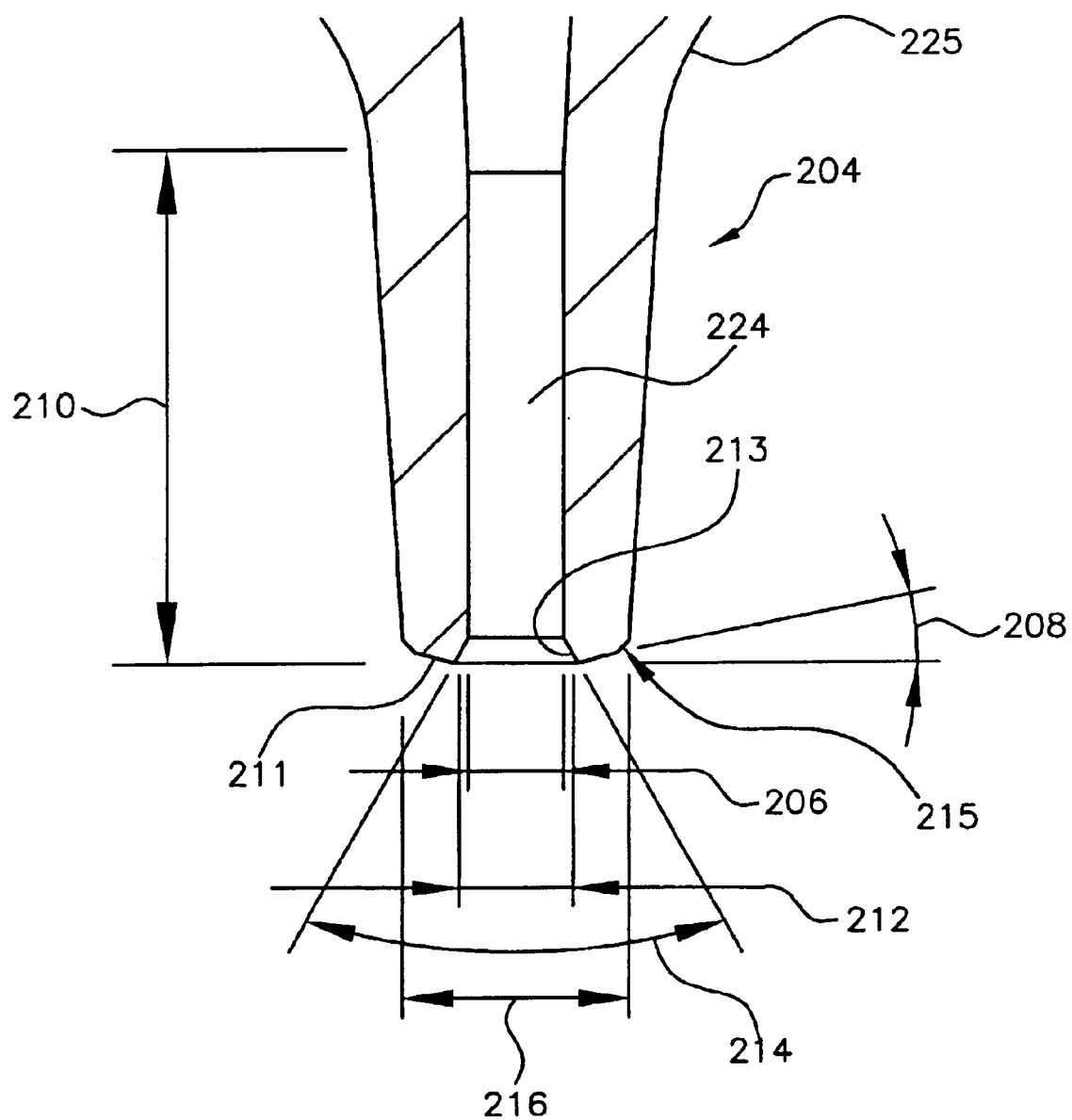

FIGS. 2C and 2F are detailed sectional views of working tip 204 of bonding tool 200. As shown in FIGS. 2C and 2F, working tip 204 has an annular working face 211 forming, i.e., an outer annular chamfer having a face angle 208 of between 8 and 15 degrees. In one exemplary embodiment, face angle 208 is at least 11, preferably between 11 and 12 degrees, and most preferably 11 degrees, to provide a strong second bond (wedge bond) by the bonding tool. Adjacent outer annular chamfer 211 is inner annular chamfer 213 having an overall angle 214 of less than 90 degrees. In a preferred embodiment, chamfer angle 214 is between 60 and 90 degrees, and most preferably about 60 degrees, in order to provide a first bond (ball bond) that meets shear and pull test requirements. In addition, inner annular chamfer 213 has a width of between 1 and 4 microns. Cylindrical passage 224 is coupled between the upper portion of chamfer 213 and axial passage 220. In one exemplary embodiment, cylindrical passage 224 has a diameter 206 of about 14 microns to accommodate a bonding wire (not shown), chamfer 213 has an outer diameter 212 of about 18 microns, and working tip 204 has a diameter 216 of about 33 microns. Diameter 206 of cylindrical passage 224 may be determined based on the diameter of the bonding wire plus 4 microns. Further, as shown in FIG. 2C, working tip 204 has a substantially constant taper 219 of between about 0 and 10 degrees and preferably about 7 degrees to avoid contact of adjacent bonding wires by bonding tool 200, and a length 210 of between about 60 and 90 microns. In a preferred embodiment length 210 is about 76.2 microns.

As the taper angles 218 and 219 of tapered portion 202 and working tip 204, respectively, are different, a transition region 225 may be placed between tapered portion 202 and working tip 204. In a preferred embodiment, transition region 225 has a radius of about between 200–350 microns. Further, in order to prevent chipping of bonding tool 200, a transition region 215 having a radius of between about 4 and 6 microns may be disposed between the lower portion of working tip 204 and outer annular chamfer 211.

Figure 3:
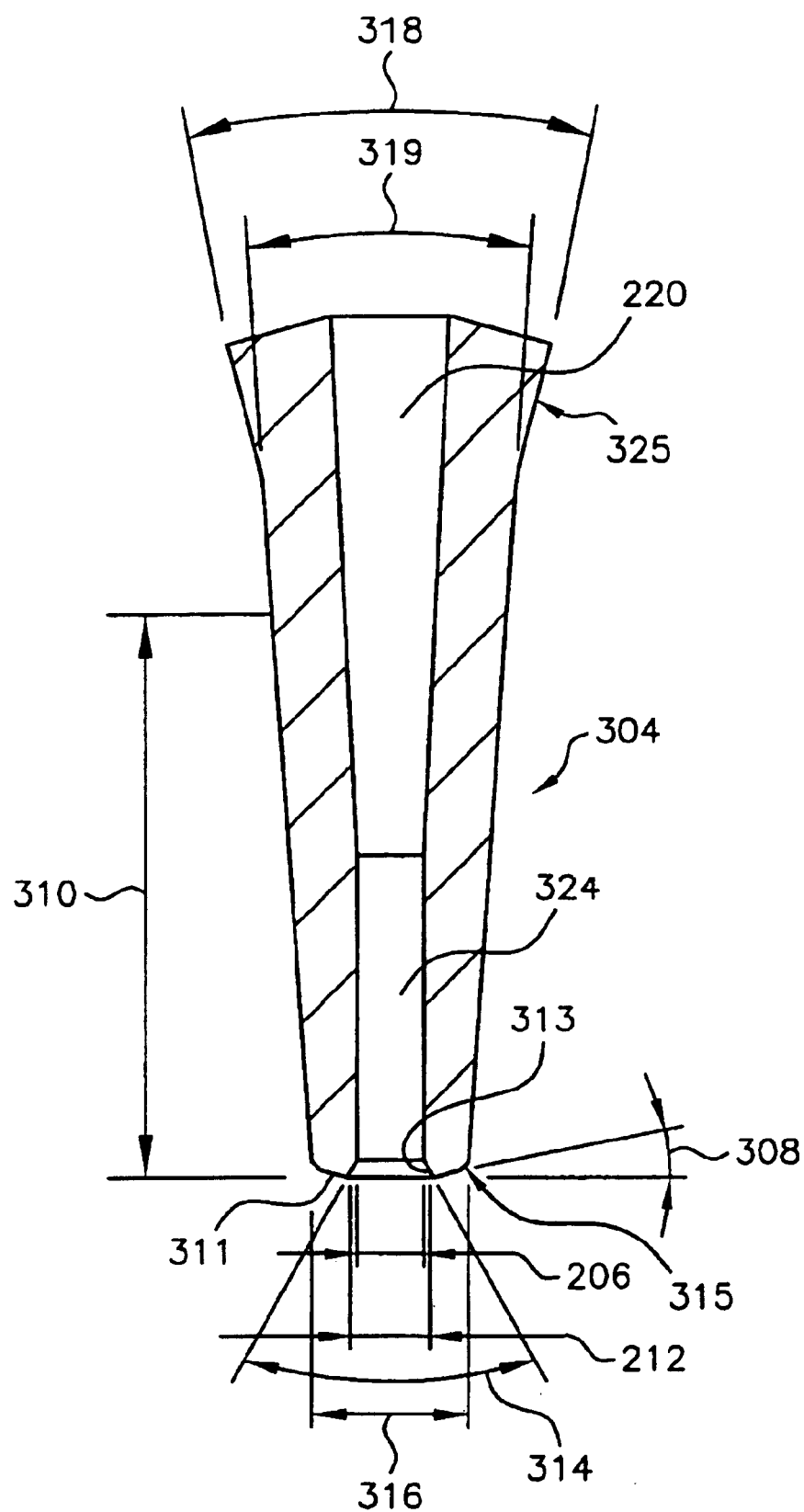
FIGS. 3A–3B are detailed sectional views of the working tip of a bonding tool according to a second exemplary embodiment of the present invention.
Figure 3A:
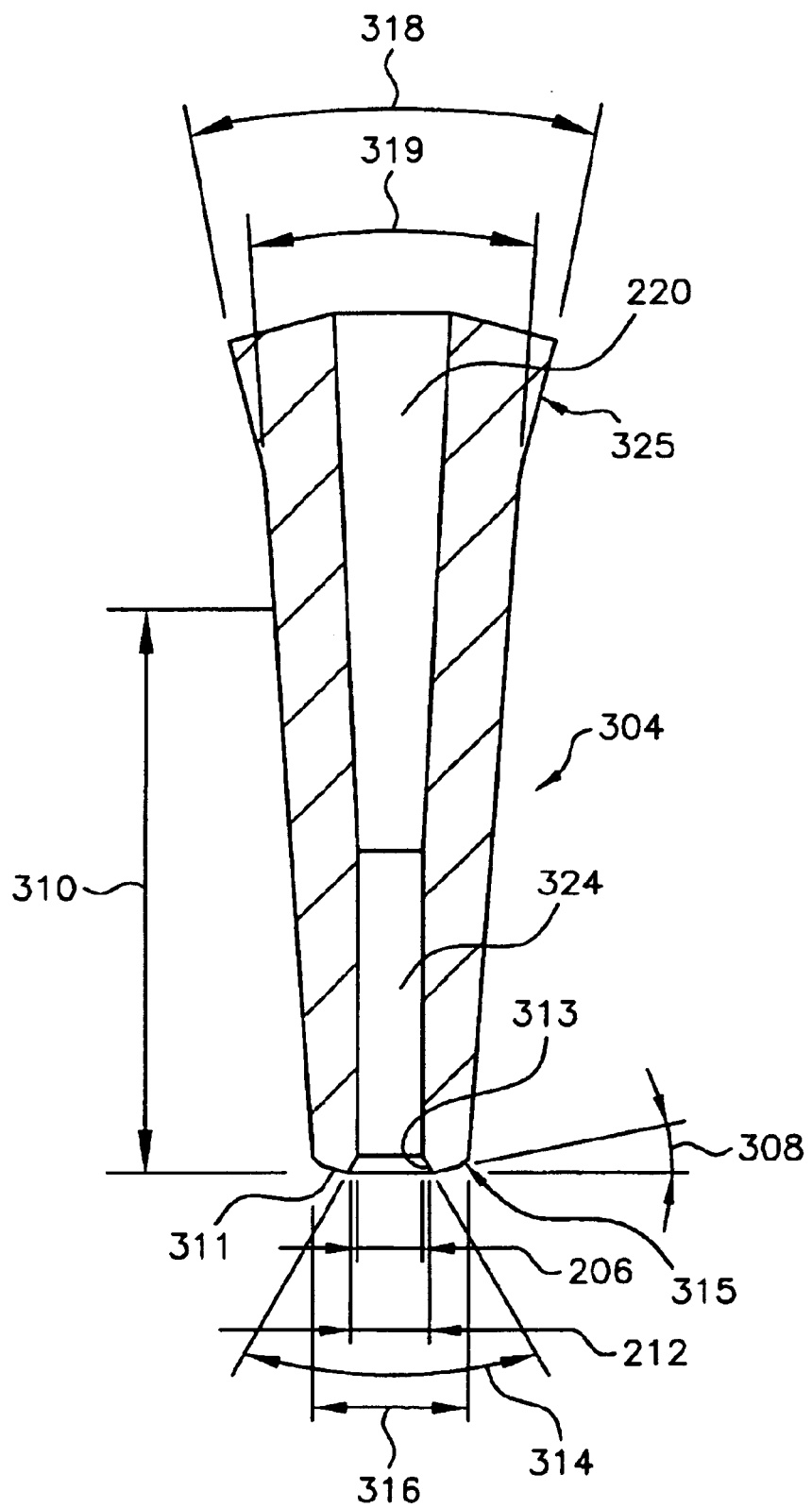
Figure 3B:
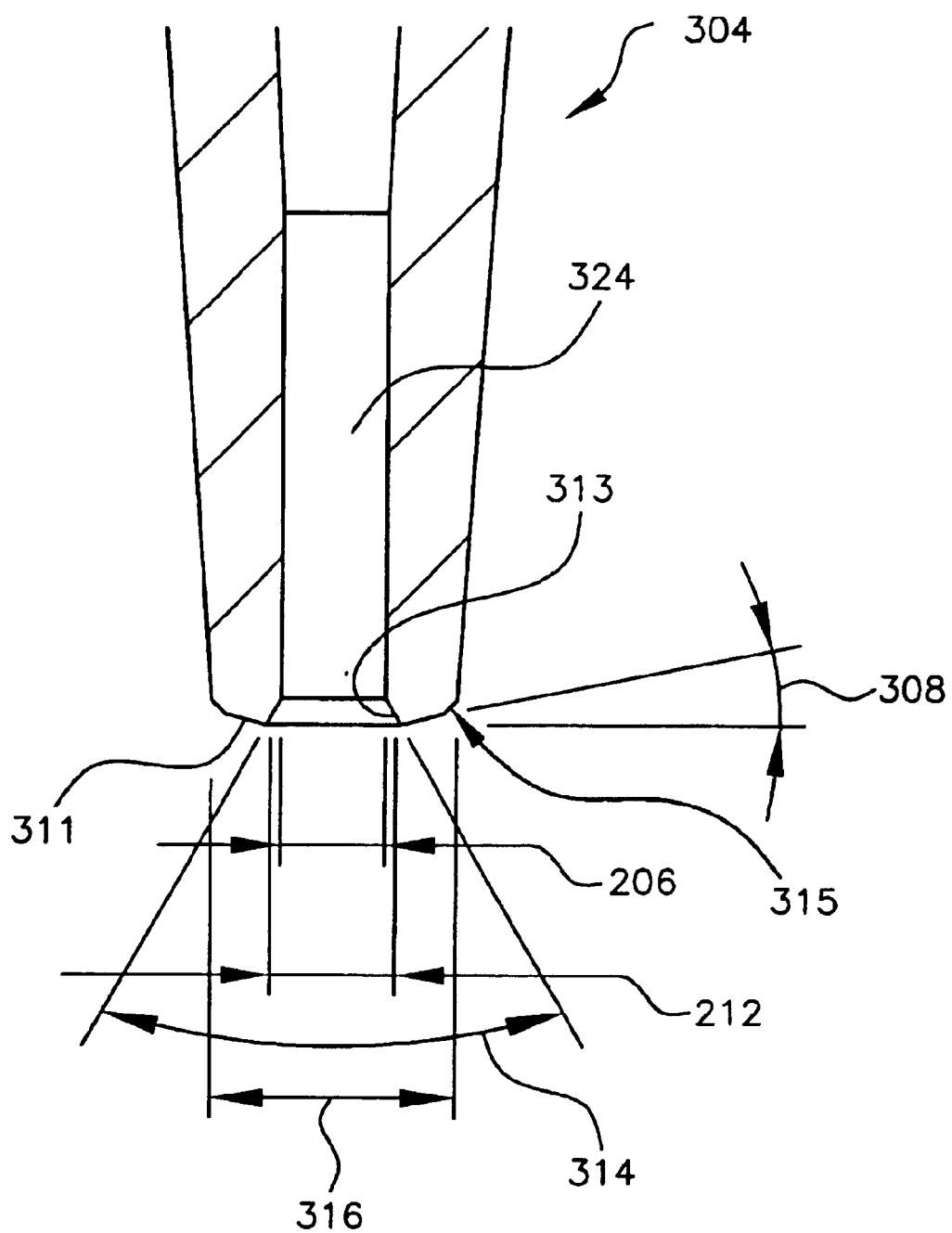

FIGS. 3A and 3B are detailed sectional views of working tip 304 according to another exemplary embodiment of the present invention. As the cylindrical body portion, tapered portion and axial passage of the bonding tool in this exemplary embodiment are essential identical to that of the first exemplary embodiment descriptions related thereto are not repeated.

As shown in FIGS. 3A and 3B, working tip 304 has a working face 311 forming, i.e., an outer annular chamfer having a face angle 308 of between 0 and 15 degrees. In one exemplary embodiment, face angle 308 is between about 10 and 12 degrees and preferably 11 degrees. Adjacent outer annular chamfer 311 is inner annular chamfer 313 having an overall angle 314 of less than 90 degrees. In a preferred embodiment, chamfer angle 314 is between 60 and 90 degrees, and most preferably about 60 degrees. In addition, annular chamfer 313 has a width of between 1 and 3 microns. Cylindrical passage 324 is coupled between the upper portion of chamfer 313 and axial passage 220. In one exemplary embodiment, cylindrical passage 324 has a diameter 306 of between about 14 and 16 microns and preferably about 15 microns to accommodate a bonding wire (not shown), chamfer 313 has an outer diameter 312 of between about 17 and 19 microns and preferably about 18 microns, and working tip 304 has a outer diameter 316 of between about 37 and 39 microns, and preferably about 38 microns. Diameter 306 of cylindrical passage 324 may be determined based on the diameter of the bonding wire plus 2 microns. Further, as shown in FIG. 3A, working tip 304 has a substantially constant taper 319 of between about 0 and 10 degrees and preferably about 7 degrees to avoid contact of adjacent bonding wires by bonding tool 200, and a length 310 of between about 117 and 137 microns. In a preferred embodiment length 310 is about 127 microns.

Figure 4:
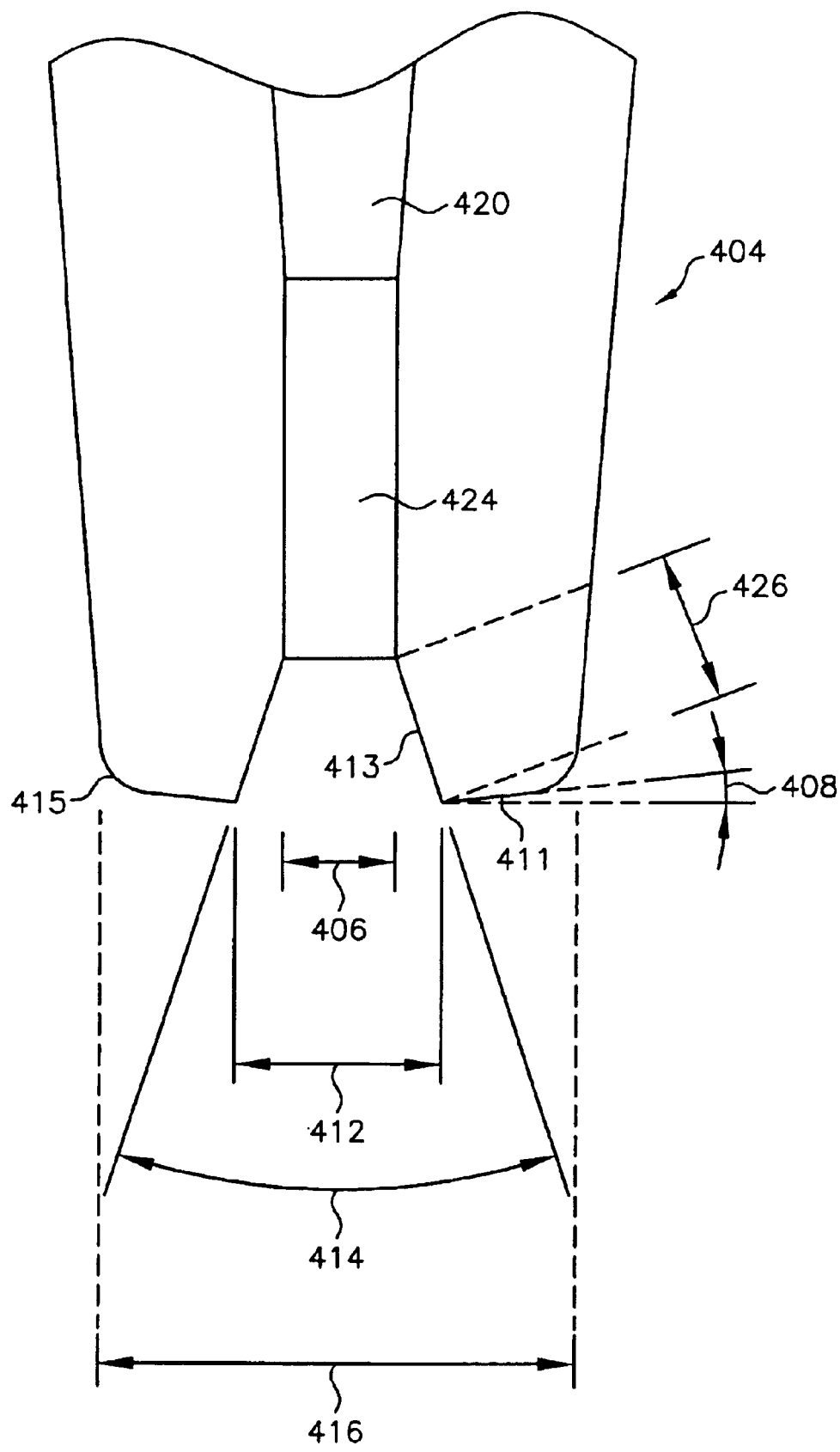
FIG. 4 is a detailed sectional view of the working tip of a bonding tool according to a third exemplary embodiment of the present invention.

Referring now to FIG. 4, a third exemplary embodiment of the present invention is illustrated with respect to a working tip only. In all other aspects this embodiment is similar to the aforementioned embodiments. As shown in FIG. 4, working tip 404 has a working face 411 forming, i.e., an outer annular chamfer having a face angle 408 of between 0 and 15 degrees. In one exemplary embodiment, face angle 408 is between about 10 and 12 degrees and preferably 11 degrees. Adjacent outer annular chamfer 411 is inner annular chamfer 413 having an overall angle 414 of 60 degrees or less. In a one embodiment, chamfer angle 414 is between 30 and 60 degrees, and in another embodiment chamfer angle 414 is about 40 degrees. The face length (FL) 426 of inner chamfer 413 is:

$$FL = (CD - H)/2 * TAN(ICA/2)$$

where CD is diameter 412 of the inner annular chamfer at the lower end adjacent working face 411, H is a diameter 406 of axial passage 424, and ICA is angle 414 of inner annular chamfer 413.

Cylindrical passage 424 is coupled between the upper portion of chamfer 413 and axial passage 420. In one exemplary embodiment, cylindrical passage 424 has a diameter 406 of between about 10 and 30 microns to accommodate a bonding wire 514 (shown in FIG. 6A). Annular chamfer 413 has an outer diameter 412 of between about 15 and 40 microns, and working tip 404 has a outer diameter 416 of between about 25 and 80 microns. Diameter 406 of cylindrical passage 424 may be determined based on the diameter of bonding wire 514 plus 2 microns. Further, and as previously shown in FIG. 3A with respect to the second exemplary embodiment, working tip 404 may have a substantially constant taper 319 of between about 0 and 10 degrees and preferably about 7 degrees to avoid contact of adjacent bonding wires by the bonding tool, and a length 310 of between about 117 and 137 microns. In a preferred embodiment length 310 is about 127 microns.

Figure 5B:
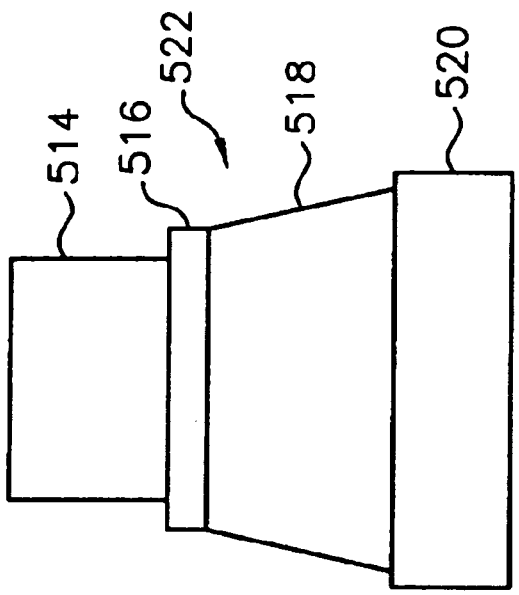
FIG. 5B is a cross-sectional view of a bond formed by the bonding tool of FIG. 4.
Figure 5A:
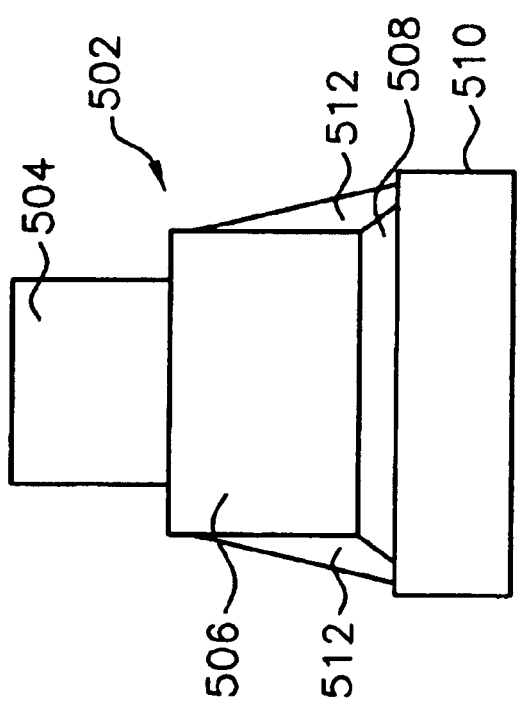
FIG. 5A is a cross-sectional view of a bond formed by a conventional bonding tool.

Referring now to FIGS. 5A and 5B, a cross sectional view of bonds formed by conventional bonding tool and a bonding tool according to the third exemplary embodiment, respectively, are shown. As shown in FIG. 5A, a conventional bonding tool forms bond 502 from bonding wire 504, having neck volume $V_N$ 506, inner chamfer volume $V_{IC}$ 508 and squash volume $V_S$ 510. The total fabrication volume $V_{FAB}$ is the sum of $V_N$, $V_S$ and $V_{IC}$. As clearly shown in FIG. 5A, $V_N$ 506 is significantly greater than $V_{IC}$ 508. Further, in a conventional boding tool $V_{IC}$ is between about 5% to 25% of $V_{FAB}$.

In contrast, and as shown in FIG. 5B, the bonding tool constructed in accordance with the third exemplary embodiment forms bond 522 from bonding wire 514, having neck volume $V_N$ 516, inner chamfer volume $V_{IC}$ 518 and squash volume $V_S$ 520. Once again the total fabrication volume $V_{FAB}$ is the sum of $V_N$, $V_S$ and $V_{IC}$. As clearly shown in FIG. 5B, $V_N$ 506 is significantly less than $V_{IC}$ 518. Further, $V_{IC}$ is between about 40% to 50% of $V_{FAB}$. To illustrate the difference between bond 502 formed by the conventional bonding tool and bond 522 formed by the bonding tool according to the third exemplary embodiment, the volume of the additional bonding material 512 contained within inner chamfer 413 is shown in FIG. 5A.

Figure 6A:
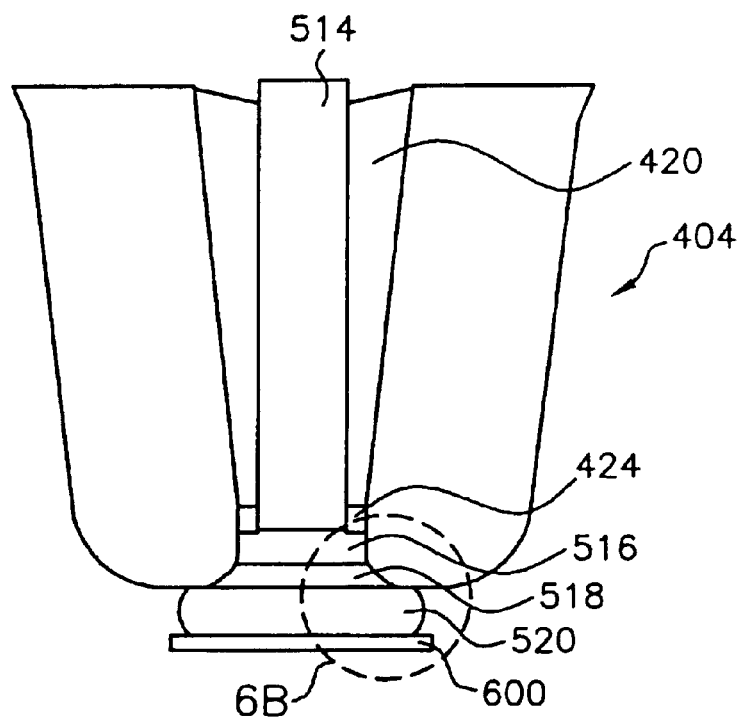
FIGS. 6A–6B are cross sectional views of the bonding tool of FIG. 4 in combination with the bond of FIG. 5B.
Figure 6B:
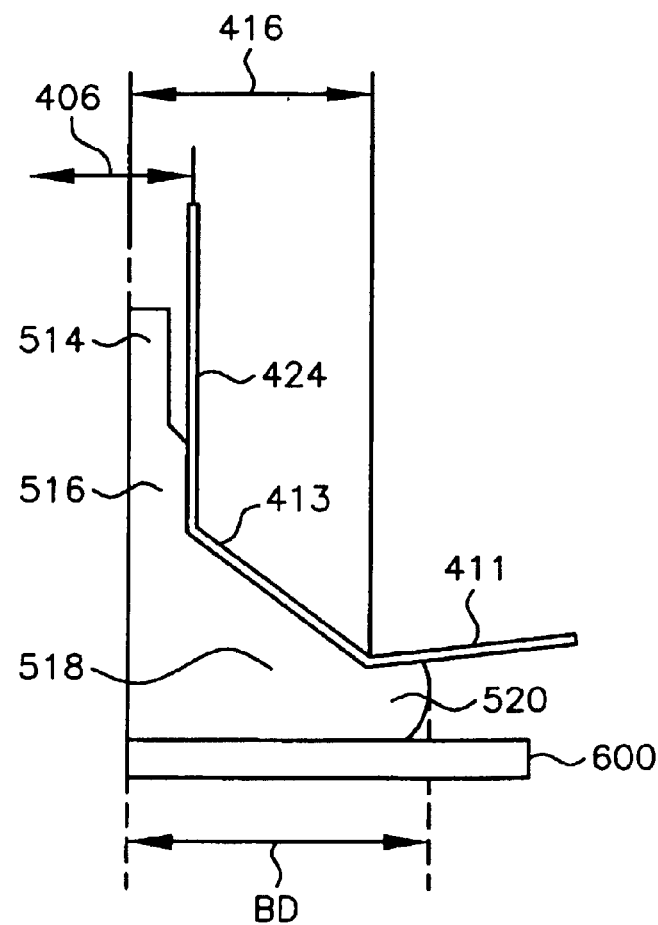

Referring now to FIGS. 6A–6B, an illustration of bond 522 as formed by working tip 404 in contact with bond pad 600 is provided. As shown in FIG. 6A and the enlarged portion shown in FIG. 6B, bond wire 514 passes through axial passage 420 to be formed by cylindrical passage 424, inner chamfer 413 and working face 411. As shown in FIG. 6B, a significant portion ($V_{IC}$ 518) of the bonding ball remains within inner chamfer 413. The resultant bonding ball has a ball diameter BD.

Figure 9:
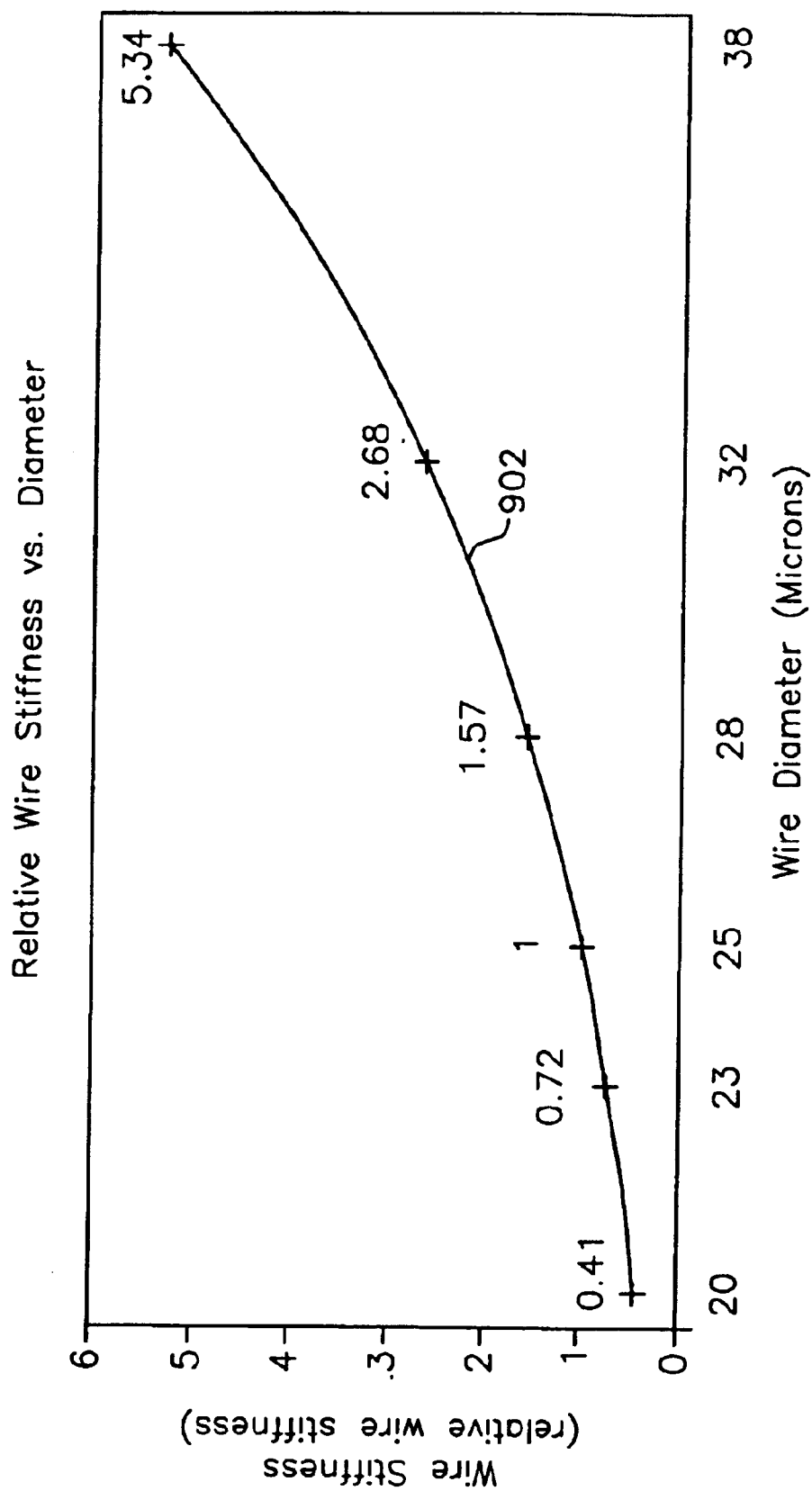
FIG. 9 is a graph illustrating relative stiffness of bonding wire vs. diameter.

This third embodiment has an additional advantage in that it allows the use of bonding wire diameters greater that those used with conventional bonding tools. For example, in wire bonding applications onto bonding pads having bonding pad pitch (BPP) of 35 microns, conventional bonding tools use bonding wire having a 15 micron diameter. In contrast, the present invention permits the use of a 16.5 micron bonding wire. In another example, where BPP is 50 microns, conventional bonding tools are limited to a 20 micron diameter bonding wire, whereas the present invention permits the use of a 23 micron bonding wire. The use of a larger diameter bonding wire provides the benefit of greater wire stiffness necessary to form tighter and better formed wire loops between the first and second bonds. For example, and as shown in FIG. 9, relative wire stiffness 902 between a 20 micron bonding wire and a 23 micron bonding wire increases by about 75%.

In other non-limiting embodiments, working tip 404 may be adapted to accommodate the following wire size vs. bonding pad pitch:

| Wire Size (in microns) | Bond Pad Pitch (in microns) |
|---|---|
| 20–23 | 50 |
| 19–20 | 45 |
| 17.5–19 | 40 |
| 15–16.5 | 35 |

Figure 7A:
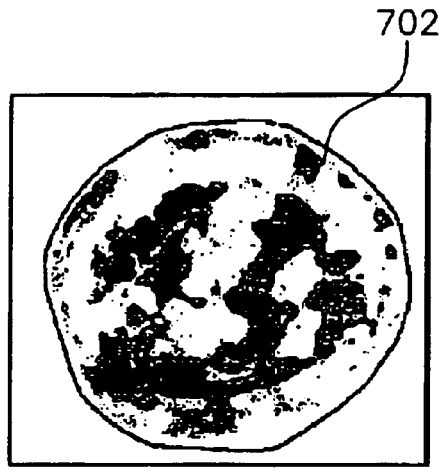
FIGS. 7A–7D are illustrations comparing Inter Metallic Coverage (IMC) of conventional bonds with bonds formed using the bonding tool of FIG. 4.
Figure 7B:
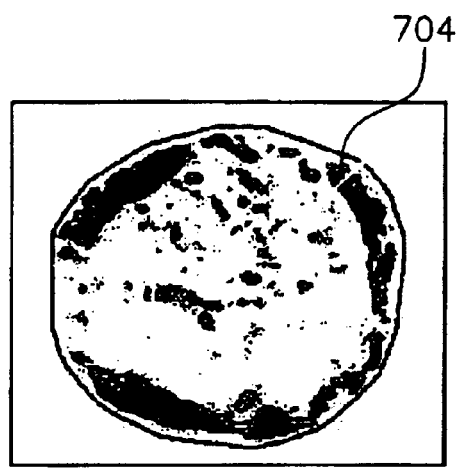
Figure 7C:
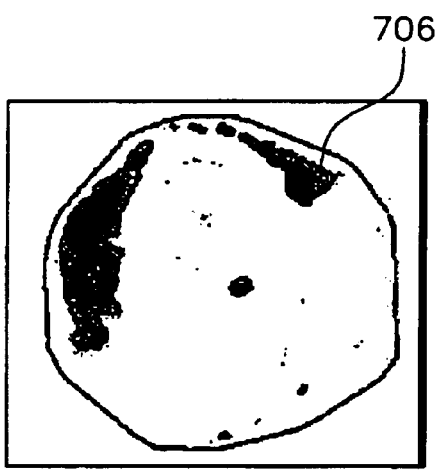
Figure 7D:
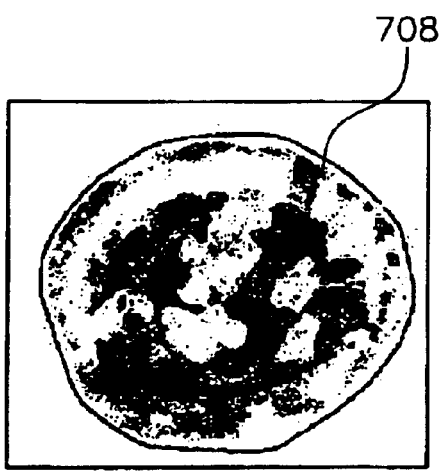
Figure 8:
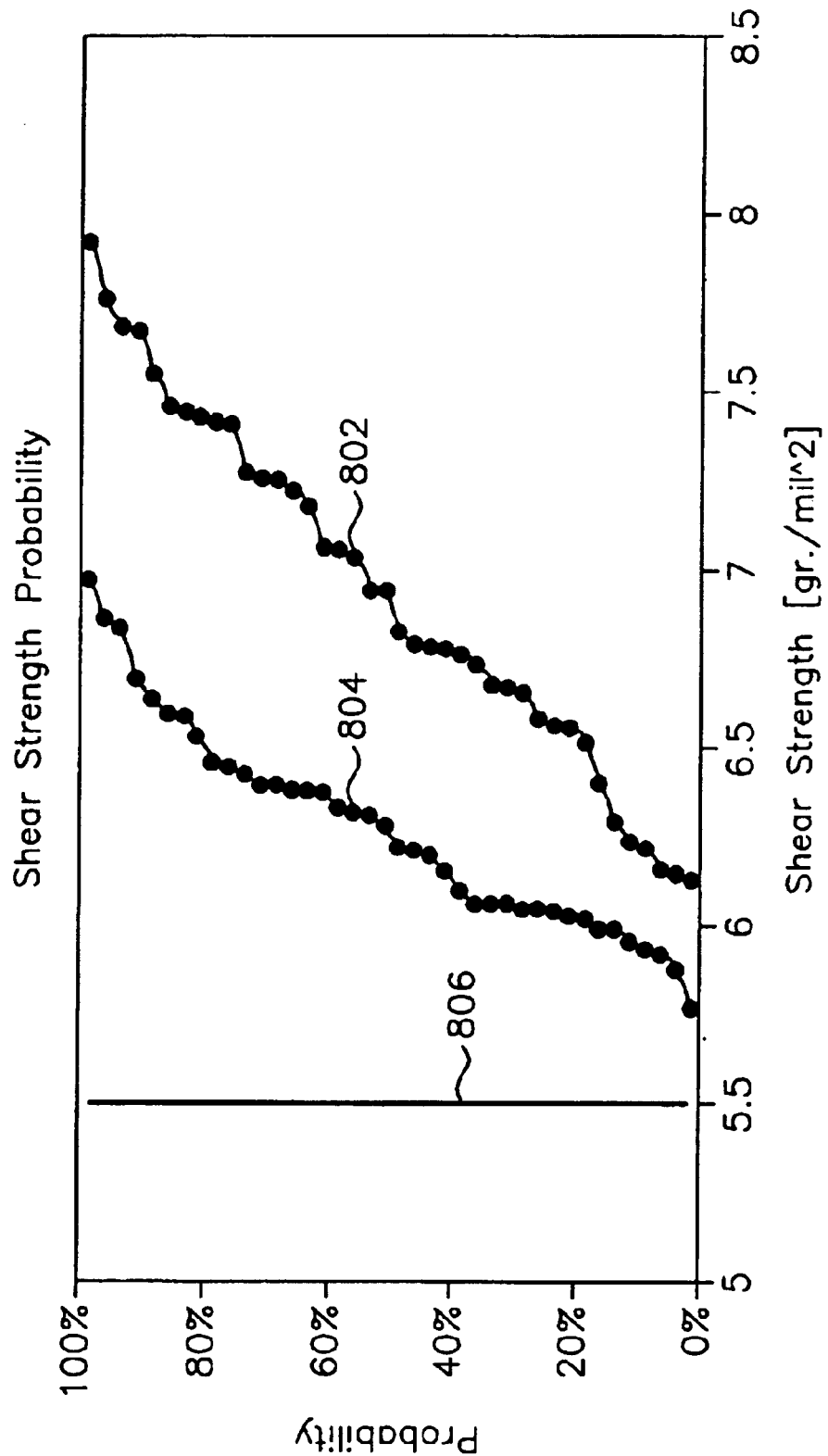
FIG. 8 is a graph comparing shear strength of conventional bonds with bonds formed with the bonding tool of FIG. 4.

Further, the use of a smaller inner chamfer angle allows a greater amount of material from the bonding ball to contact the bonding bad. The inventors have termed this ball to pad contact "Inter Metallic Coverage" or IMC. During the bonding process, the bonding ball is pressed against the bonding pad and ultrasonic energy is transferred from an ultrasonic transducer (not shown) coupled to the bonding tool and, in turn, into the bonding pad. Because of the additional volume of the fabrication ball contained within the inner chamfer area, there is a greater IMC between the bonding ball and the boning pad. This IMC has been found by the inventors to be greater than 82% (and in most cases well over 92%) in sharp contrast to conventional bonding tools which achieve less than 82% IMC at best. This is illustrated in FIGS. 7A–7D. As shown in FIG. 7A, with bond pads having a 50 micron BPP a conventional bonding tool using a 20 micron (0.8 mil) wire provides IMC 702 of 72%. In contrast, and as illustrated in FIG. 7B, using the same wire size with an identical BPP, the exemplary bonding tool provides an IMC 704 of 88%. In another example using a 0.8 mil wire with a 45 micron BPP, convention IMC 706 (shown in FIG. 7C) is 82%, whereas using the exemplary bonding tool a 92% IMC 708 (shown in FIG. 7D) is achieved. Thus, an increased IMC of 22% and 12%, respectively, is achieved in these two examples between conventional bonding tools and the bonding tool in accordance with the third exemplary embodiment.

Providing a bonding tool such as that described above is merely half the battle in meeting the needs of the semiconductor industry. It is important to be able to form the bonding tool form a material that is sufficiently strong to withstand the forces exerted on the tool during the bonding process, yet resilient enough to flex as needed without breaking. The inventors have determined that by forming the bonding tool from at least 80% Zirconia ($ZrO_2$) by weight these needs are met.

In one embodiment of the present invention, Yttria stabilized Zirconia is used to form the bonding tool. In this embodiment, about 95% by weight of Zirconia is combined with about 5% by weight of $Y_2O_3$. The inventors have determined that pure Zirconia undergoes a phase transformation process during heat treatment. Pure Zirconia is monoclinic at room temperature and changes to a denser tetragonal form at about 1000 C. This involves a large volume change and creates cracks within its structures during the sintering process at a temperature of between about 1350 and 1600° C.

Additional amounts of $Y_2O_3$ create a mixture of the cubic phase and the monoclinic phase at low temperatures, such as less than 900° C. This phase transformation process that takes place with the presence of the cubic phase and involves with much less volume change, which, in turn, reduces the thermal stresses and minimizes the formation of microcracks. This material has a much higher bending strength than conventional Alumina based materials, and, as a result, improves the manufacturing capabilities of the bonding tool.

In another exemplary embodiment, up to 22% $AL_2O_3$ by weight is added to the Yttria stabilized Zirconia. This material has an acoustic behavior similar to that of conventional Alumina based materials.

In a further exemplary embodiment, the bonding tool is formed from of the combinations (by weight) of materials listed in Table 1.

TABLE 1

| Material | Alumina | Yttria | Zirconia |
|---|---|---|---|
| Combination 1 | about 0.15% to about 0.35% | about 4.95% to about 5.35% | about 94.3% to about 94.9% |
| Combination 2 | about 18% to about 22% | about 3.6% to about 4.2% | about 73.8% to about 78.4% |
| Combination 3 | about 75% | about 1.36% | about 23.64% |
| Combination 4 | about 91.64% | about 0.45% | about 7.91% |
| Combination 5 | about 83.5% | about 0.81% | about 15.6% |

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A bonding tool for bonding a fine wire to a substrate, the bonding tool comprising:
   a working tip at an end of the bonding tool having an inner annular chamfer having a predetermined angle formed at an inner portion of the end of the working tip; and
   a substantially cylindrical axial passage coupled to an upper end of the inner annular chamfer,
   wherein the inner chamfer having a face length FL where:

$$FL=(CD-H)/2*\text{TAN}(ICA/2)$$

where CD is a diameter of the inner annular chamfer at a lower end thereof, H is a diameter of the axial passage, and ICA is the angle of the inner annular chamfer.

2. The bonding tool according to claim 1, wherein the working tip forms a bond between the wire and a bond pad on the substrate having an inter metallic bond coverage of at least about 90%.

3. The bonding tool according to claim 1, wherein the bond between the wire and a bond pad has a shear strength of at least about 5.5 grams/mils$^2$.

4. The bonding tool according to claim 1, wherein the working tip is adapted to bond the wire to a bond pad where a pitch between adjacent bond pads is about 35 $\mu$m and the bond wire has a diameter range of about 15–16.5 $\mu$m.

5. The bonding tool according to claim 1, wherein the working tip is adapted to bond the wire to a bond pad where a pitch between adjacent bond pads is about 40 $\mu$m and the bond wire has a diameter range of about 17.5–19 $\mu$m.

6. The bonding tool according to claim 1, wherein the working tip is adapted to bond the wire to a bond pad where a pitch between adjacent bond pads is about 45 $\mu$m and the bond wire has a diameter range of about 19–20 $\mu$m.

7. The bonding tool according to claim 1, wherein the working tip is adapted to bond the wire to a bond pad where a pitch between adjacent bond pads is about 50 $\mu$m and the bond wire has a diameter range of about 20–23 $\mu$m.

8. The bonding tool according to claim 1, wherein the fine wire is formed by the working tip to have a Fabrication Volume $V_{FAB}$, the Fabrication Volume comprised of a Neck Volume $V_N$, a Inner Chamfer Volume $V_{IC}$ and a Squash Volume $V_S$, where:
   $V_{IC}$ is between about 40% to 50% of $V_{FAB}$, and $$V_{FAB}=V_N+V_{IC}+V_S.$$

9. The bonding tool according to claim 1, wherein the inner annular chamfer has an overall angle of less than 60°.

10. The bonding tool according to claim 1, wherein the inner annular chamfer has an overall angle of between about 30 degrees and 60 degrees.

11. The bonding tool according to claim 10, wherein the outer annular chamfer has a face angle of between about 10° and 12°.

12. The bonding tool according to claim 1, wherein the inner annular chamfer has an overall angle of about 40 degrees.

13. The bonding tool according to claim 1, wherein the diameter of the axial passage is between about 10 microns and 30 microns.

14. The bonding tool according to claim 1, wherein the working tip further comprises a tapered section having a length of less than about 230 microns.

15. The bonding tool according to claim 14, wherein the tapered section has an outside diameter of less than about 80 microns.

16. The bonding tool according to claim 14, wherein an overall angle of the tapered section is less than 10°.

17. The bonding tool according to claim 14 wherein an overall angle of the tapered section is about 7°–10°.

18. The bonding tool according to claim 1, wherein the bonding tool is formed from a material comprising i) between about 0.15%–0.35% Alumina by weight, ii) between about 4.95%–5.35% Yttria by weight, and iii) between about 94.3% to 94.9% Zirconia by weight.

19. The bonding tool according to claim 1, wherein the bonding tool is formed from a material comprising i) between about 18%–22 Alumina by weight, ii) between about 3.6%–4.2% Yttria by weight, and iii) between about 73.8% to 78.4% Zirconia by weight.

20. The bonding tool according to claim 1, wherein the bonding tool is formed from a material comprising i) about 75% Alumina by weight, ii) about 1.36% Yttria by weight, and iii) about 23.64% Zirconia by weight.

21. The bonding tool according to claim 1, wherein the bonding tool is formed from a material comprising i) about 91.64% Alumina by weight, ii) about 0.45% Yttria by weight, and iii) about 7.91% Zirconia by weight.

22. The bonding tool according to claim 1, wherein the bonding tool is formed from a material comprising i) about 83.5% Alumina by weight, ii) about 0.81% Yttria by weight, and iii) about 15.6% Zirconia by weight.

23. The bonding tool according to claim 1, wherein the bonding tool is formed from a material comprising about 95% $ZrO_2$ by weight and about 5% $Y_2O_3$ by weight.

24. The bonding tool according to any of claims 18–23, wherein the material is sintered at a temperature of at least 1350° C.

25. The bonding tool according to claim 1, wherein the bonding tool is formed from a unitary piece of material.

26. The bonding tool according to claim 1, wherein working tip forms a bond between the wire and a bond pad on the substrate having an inter metallic bond coverage of at least about 82%.

27. A bonding tool for bonding a fine wire to a substrate, the bonding tool comprising:
   a cylindrical section having a diameter;
   a first tapered section coupled to an end of the cylindrical section, and having a first predetermined angle with respect to a longitudinal axis of the cylindrical section; and
   a second tapered section coupled to an end of the first tapered section, the second tapered section having:
      i) a length of between about 70 microns and 230 microns,
      ii) an angle of between about 7°–10° with respect to the longitudinal axis of the cylindrical section, and
      iii) an inner annular chamfer formed at an inside portion of the second tapered section and adjacent an end thereof, the inner annular chamfer having an angle of less than about 60°.

28. The bonding tool according to claim 27 wherein the fine wire is formed by the working tip to have a Fabrication Volume $V_{FAB}$, the Fabrication Volume comprised of a Neck Volume $V_N$, an Inner Chamfer Volume $V_{IC}$ and a Squash Volume $V_S$, where:
   $V_{IC}$ is between about 40% to 50% of $V_{FAB}$, AND $$V_{FAB}=V_N+V_{IC}+V_S.$$

29. The bonding tool according to claim 27, wherein working tip forms a bond between the wire and a bond pad on the substrate having an inter metallic bond coverage of at least about 82%.

30. The bonding tool according to claim 27, wherein the bonding tool is formed from a material comprising i) between about 0.15%–0.35% Alumina by weight, ii) between about 4.95%–5.35% Yttria by weight, and iii) between about 94.3% to 94.9% Zirconia by weight.

31. The bonding tool according to claim 27, wherein the bonding tool is formed from a material comprising i) between about 18%–22 Alumina by weight, ii) between about 3.6%–4.2% Yttria by weight, and iii) between about 73.8% to 78.4% Zirconia by weight.

32. The bonding tool according to claim 27, wherein the bonding tool is formed from a material comprising i) about 75% Alumina by weight, ii) about 1.36% Yttria by weight, and iii) about 23.64% Zirconia by weight.

33. The bonding tool according to claim 27, wherein the bonding tool is formed from a material comprising i) about 91.64% Alumina by weight, ii) about 0.45% Yttria by weight, and iii) about 7.91% Zirconia by weight.

34. The bonding tool according to claim 27, wherein the bonding tool is formed from a material comprising i) about 83.5% Alumina by weight, ii) about 0.81% Yttria by weight, and iii) about 15.6% Zirconia by weight.

35. The bonding tool according to claim 27, wherein the bonding tool is formed from a material containing about 95% $ZrO_2$ by weight and about 5% $Y_2O_3$ by weight.

36. The bonding tool according to claim 27, wherein the inner annular chamfer has an overall angle of between about 30 degrees and 60 degrees.

37. The bonding tool according to claim 27, wherein the inner annular chamfer has an overall angle of about 40 degrees.

38. A method for making a bonding tool for bonding a wire to a bonding pad, comprising the steps of:
   forming a working tip at an end of the bonding tool;
   forming a working face at an end of the working tip;
   forming a inner annular chamfer having:
      i) a face length FL where:

$$FL=(CD-H)/2*TAN(ICA/2)$$

where CD is a diameter of the inner annular chamfer at a lower end thereof, H is a diameter of the axial passage, and ICA is the angle of the inner annular chamfer, and
      ii) an overall angle of less than 60 ° at an inner portion of the end of the working tip; and
   forming a substantially cylindrical axial passage at an upper end of the second annular chamfer.

39. A method for making a bonding tool for bonding a wire to a bonding pad, comprising the steps of:
   forming a working tip at an end of the bonding tool;
   forming a working face at an end of the working tip;

forming a inner annular chamfer having:
   i) a face length FL where:

$$FL = (CD-H)/2 * TAN(ICA/2)$$

where CD is a diameter of the inner annular chamfer at a lower end thereof, H is a diameter of the axial passage, and ICA is the angle of the inner annular chamfer, and
   ii) an overall angle of less than 40° at an inner portion of the end of the working tip; and
forming a substantially cylindrical axial passage at an upper end of the second annular chamfer.

40. A method of forming a wire bond against a bonding pad with a bonding wire using a bonding tool having a working tip, comprising the steps of:
   melting the bonding wire to produce a bonding ball adjacent the at the end of the working tip;
   pressing the bonding ball against the bonding pad with the working tip; and
   forming the bonding ball to have a Fabrication Volume $V_{FAB}$, the Fabrication Volume comprised of a Neck Volume $V_N$, an Inner Chamfer Volume $V_{IC}$ and a Squash Volume $V_S$, where:
   $V_{IC}$ is between about 40% to 50% of $V_{FAB}$, AND $$V_{FAB} = V_N + V_{IC} + V_S.$$

41. The method according to claim 40, wherein working tip forms a bond between the wire and the bonding pad having an inter metallic bond coverage of at least about 82%.

* * * * *